US008609511B2

(12) United States Patent
Shirono et al.

(10) Patent No.: US 8,609,511 B2
(45) Date of Patent: Dec. 17, 2013

(54) SEMICONDUCTOR DEVICE MANUFACTURING METHOD, SEMICONDUCTOR DEVICE, AND CAMERA MODULE

(75) Inventors: Takashi Shirono, Tokyo (JP); Kazumasa Tanida, Oita (JP); Naoko Yamaguchi, Kanagawa (JP); Satoshi Hongo, Oita (JP); Tsuyoshi Matsumura, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 13/220,001

(22) Filed: Aug. 29, 2011

(65) Prior Publication Data

US 2012/0068290 A1 Mar. 22, 2012

(30) Foreign Application Priority Data

Sep. 16, 2010 (JP) ................................. 2010-208067

(51) Int. Cl.
*H01L 21/46* (2006.01)

(52) U.S. Cl.
USPC ........... 438/458; 438/406; 438/455; 438/459; 427/446; 257/432; 257/E21.568; 257/E31.127; 257/E21.088; 257/E21.122

(58) Field of Classification Search
None
See application file for complete search history.

(56) References Cited

U.S. PATENT DOCUMENTS

| 7,675,101 | B2 | 3/2010 | Hwang | |
|---|---|---|---|---|
| 7,795,065 | B2 | 9/2010 | Hwang | |
| 7,989,907 | B2 | 8/2011 | Inoue | |
| 2008/0283916 | A1* | 11/2008 | Yamazaki | 257/347 |
| 2008/0308897 | A1* | 12/2008 | Kakehata et al. | 257/507 |
| 2009/0029525 | A1* | 1/2009 | Ohnuma | 438/458 |
| 2011/0073983 | A1 | 3/2011 | Tanida et al. | |

FOREIGN PATENT DOCUMENTS

| JP | 2-194558 | 8/1990 |
|---|---|---|
| JP | 10-116977 | 5/1998 |
| JP | 2005-322745 | 11/2005 |
| JP | 2009-99875 | 5/2009 |
| JP | 2009-117802 | 5/2009 |
| JP | 2010-62414 | 3/2010 |
| JP | 2010-98219 | 4/2010 |

OTHER PUBLICATIONS

U.S. Appl. No. 13/152,057, filed Jun. 2, 2011.
Japanese Office Action issued Jan. 22, 2013, in Patent Application No. 2010-208067 (with English-language translation).
U.S. Appl. No. 13/422,966, filed Mar. 16, 2012, Yamaguchi, et al.
U.S. Appl. No. 13/428,424, filed Mar. 23, 2012, Hongo.

* cited by examiner

*Primary Examiner* — Yasser Abdelaziez
(74) *Attorney, Agent, or Firm* — Oblon, Spivak, McClelland, Maier & Neustadt, L.L.P.

(57) ABSTRACT

According to one embodiment, an insulation film is formed over the surface, backside, and sides of a first substrate. Next, the insulation film formed over the surface of the first substrate is removed. Then, a joining layer is formed over the surface of the first substrate, from which the insulation film has been removed. Subsequently, the first substrate is bonded to a second substrate via a joining layer.

7 Claims, 5 Drawing Sheets

SEMICONDUCTOR DEVICE MANUFACTURING METHOD, SEMICONDUCTOR DEVICE, AND CAMERA MODULE

CROSS-REFERENCE TO RELATED APPLICATIONS

This application is based upon and claims the benefit of priority from the prior Japanese Patent Application No. 2010-208067, filed on Sep. 16, 2010; the entire contents of which are incorporated herein by reference.

FIELD

Embodiments described herein relate generally to a semiconductor device manufacturing method, a semiconductor device, and a camera module.

BACKGROUND

In a conventional CMOS (Complementary Metal Oxide Semiconductor) image sensor, a photodiode is formed over a silicon substrate, and wiring is formed over this photodiode. However, from the viewpoints of improvement in light efficiency and degree of flexibility in design, a backside-illuminated CMOS image sensor has attracted attention, in which light is made incident from an opposite side (i.e., the backside) of a face where a photodiode is formed.

In the backside-illuminated COMS image sensor, a silicon substrate (hereinafter referred to as "device substrate") over which a photodiode and so on are formed needs to be thinned by mechanical or chemical polishing in order to shorten the distance to the photodiode. When the device substrate is thinned, the device substrate alone cannot withstand polishing pressure. Therefore, the device substrate is thinned after the support substrate is bonded to the device substrate.

However, it is assumed that a conventional backside-illuminated CMOS image sensor undergoes a conventional wafer process after the support substrate is bonded to the device substrate. Accordingly it is easy to imagine that, as a result of metal contamination, a general silicon substrate for use as a support substrate may degrade device characteristics.

DETAILED DESCRIPTION

According to one embodiment, an insulation film is formed over the surface, backside, and sides of a first substrate. Next, the insulation film formed over the surface of the first substrate is removed. Then, a joining layer is formed over the surface of the first substrate, from which the insulation film has been removed. Subsequently, the first substrate is bonded to a second substrate 2 via a joining layer.

Exemplary embodiments of a semiconductor device manufacturing method, a semiconductor device, and a camera module will be explained below in detail with reference to the accompanying drawings. The present invention is not limited to the following embodiments.

First Embodiment

FIGS. 1A to 1D illustrate an example of a semiconductor device manufacturing method according to a first embodiment. The semiconductor device according to the embodiment is used as, for example, a backside-illuminated CMOS image sensor. A description of a semiconductor device for use as a backside-illuminated COMS image sensor is given as an example. However, the present invention encompasses any semiconductor devices other than backside-illuminated CMOS image sensors, as long as they are formed by a manufacturing method including the step of bonding a substrate and a support substrate.

Figure 1A:
FIGS. 1A to 1D illustrate an example of a semiconductor device manufacturing method according to a first embodiment.

First, as illustrated in FIG. 1A, using a CVD (Chemical Vapor Deposition) method or a coating method, a thin film 2, serving as an insulation film, is formed so as to cover all the faces (i.e., surface, backside, and sides) of the substrate 1. Next, a protective film 3 is formed so as to cover the entire thin film 2. The substrate 1 may be formed from any material. However, for example, a silicon substrate may be used. The thin film 2 may be, for example, a silicon dioxide ($SiO_2$) film. The protective film 3 is an insulation film, and formed from a material that prevents metal contamination. The protective film 3 may be, for example, a Silicon Nitride ($Si_3N_4$) film formed from silane and ammonia, or Silicon Carbide (SiC) film formed from hydrocarbons such as ethylene ($C_2H_4$) and propane ($C_3H_8$). The thickness of the thin film 2 and the thickness of the protective film 3 may have any value. However, these could be, for example, about 1 nm to 100 nm.

Figure 1B:

Subsequently, as illustrated in FIG. 1B, using dry etching, the protective film 3 covering the surface or back (opposite to the top in FIG. 1) of the thin film 2 is removed. The protective film 3 may be removed by wet etching, instead of dry etching. Alternatively, it may be removed by both dry and wet etching.

Figure 1C:

Further, as illustrated in FIG. 1C, the thin film 2 from the surface of which the protective film 3 has been removed by wet etching is also removed to expose the surface of the substrate 1. Instead of wet etching, the thin film 2 may be removed by dry etching or by both dry and wet etching. However, it is preferable to use wet etching in order to make the surface of the substrate 1 smooth after the removal of the thin film 2.

Figure 1D:

Then, as illustrated in FIG. 1D, using wet processing, a joining layer 4, which is a natural oxide film, is formed over the surface of the exposed substrate 1. In this case, a processing chemical for wet processing may be, for example, ozone water or choline hydrogen peroxide.

In the embodiment, wet processing is adopted for the formation of the joining layer 4. This is because wet processing enables the formation of a joining layer 4 with a smooth surface, and the removal of the thin film 2 or dust that may settle when dry etching is carried out to remove the thin film 2. The joining layer 4 may be formed using a CVD method or the like instead of wet processing. However, forming a joining layer 4 using other than wet processing will not ensure a smooth joining layer 4. Therefore, the surface of the joining layer 4 is polished smooth after its formation.

Through the foregoing procedure, a support substrate 5 is formed in which its surface is covered with the joining layer 4 and its backside and sides are covered with the thin film 2 and protective film 3. Thereafter, the support substrate 5 and a target substrate (i.e., device substrate) are bonded together via the joining layer 4.

Figure 2:
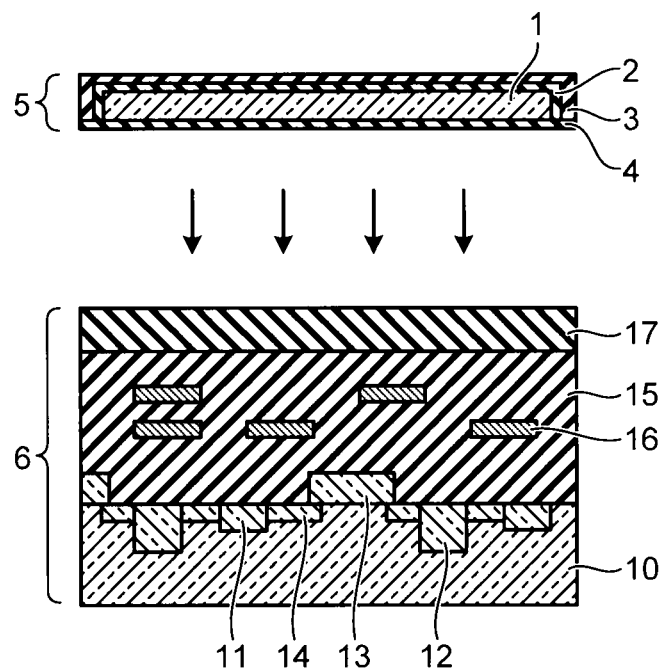
FIG. 2 illustrates an example of the configuration of a device substrate to be bonded to a support substrate according to the first embodiment.

FIG. 2 illustrates an example of the configuration of a device substrate 6 to be bonded to the support substrate 5. This device substrate 6 is a semiconductor substrate including an active layer, a wiring layer, etc., and is formed by the following procedure. First, an opening is formed on the surface of a silicon substrate 10 by resist exposure and etching. The opening is filled by a CVD or coating method with an insulation material such as a silicon oxide or silicon nitride film, and a semiconductor area 11, which is an active layer, is formed by a STI (Shallow Trench Isolation) method. Subsequently, a light receiving element 12, a gate 13, and a source and drain 14 are formed as an active layer on the silicon substrate 10. Formed on the active layers are a multi-wiring layer formed by repeating the deposition of an interlayer insulation film 15 and the formation of copper or aluminum wiring 16. Then, a joining layer 17 is formed over the uppermost layer (i.e., over the multi-wiring layer).

The joining layer 17 may be, for example, an SiO2 film formed from silane or TEOS (Tetraethyl orthosilicate), a SiOC (Silicon Oxide) film formed from organic silane, a Si3N4 (Silicon Nitride) film formed from silane and ammonia, or a PSG (Phosphorus Silicon Glass) film formed from phosphine. Where spin coating is used, the joining layer 17 may by a SOG (Spin On Glass) film formed from silanol, a MSQ (Methyl Silses Quioxane), which is an organic material, or a polyimide film. Alternatively, films formed from two or more materials may be bonded together to be the joining layer 17.

Figure 3:
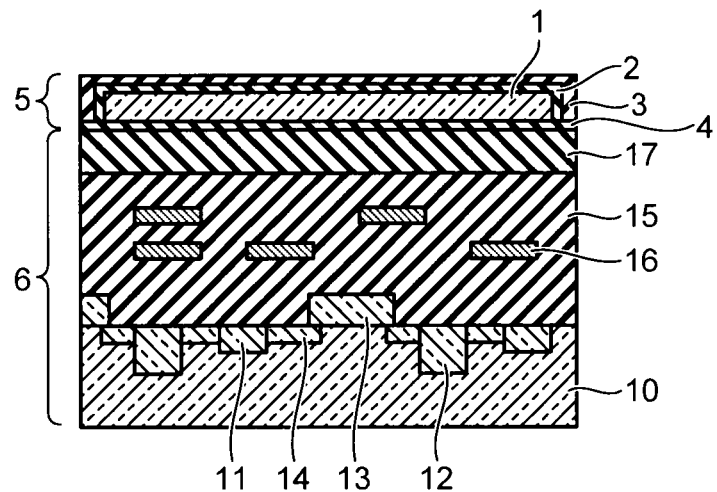
FIG. 3 illustrates an example of the configuration of a semiconductor substrate according to the first embodiment.

FIG. 3 illustrates an example of the configuration of the semiconductor substrate after the bonding process illustrated in FIG. 2 (i.e., the semiconductor substrate formed by bonding the device substrate 6 to the support substrate 5).

The device substrate 6 that is bonded to the support substrate 5 is not limited to the configuration exemplified in FIG. 2. A device substrate of any configuration may be used, as long as the face to be bonded to the support substrate 5 is processed so as to be suitable for bonding (for example, the joining layer 17 is formed).

When the joining layer 17 and the surface (joining layer 4) of the support substrate 5 are bonded together, a washing process for the surface of the joining layer 17 and the surface of the support substrate 5 is performed to remove organic substances or metal contaminants, such as Cu and Al, on those surfaces. The washing process may be, for example, organic washing using, for example, acetone, alcohol, or aqueous ozone. Alternatively, the washing process may be wet processing, such as acid-alkali washing, using, for example, HF (hydrogen fluoride), DHF (dilute hydrofluoric acid), sulfuric acid-hydrogen peroxide, ammonia hydrogen peroxide, or hydrochloric acid-hydrogen peroxide. Equally, the washing process may be a dry process, such as a plasma process, in which excitation is caused using one or more gases selected from a group of, for example, hydrogen, nitrogen, oxygen, N2O (nitrous oxide), argon, and helium.

In this case, using nitrogen as a gas in the plasma process nitrogenizes part of the surface of the oxide film, resulting in not only O—H hydrogen bonding but also N—H hydrogen bonding. Hence, the use of nitrogen gas is preferable as it strengthens the wafer-joining force. Alternatively, the washing process may be a combination of the wet and dry processes. It is appropriate for the washing process to process both the surfaces of the joining layer 17 and support substrate 5. However, one only of the surfaces may be processed.

In the present embodiment, the protective film 3 is formed after the formation of the thin film 2 on the support substrate 5. However, the protective film 3 may be directly formed on the support substrate 5 without formation of the thin film 2. Generally, it is preferable to form the thin film 2, such as an oxide film, and then the protective film 3 of a material that prevents metal contamination, rather than to form this protective film 3 directly on the support substrate 5. This is because forming the protective film 3 after the thin film 2 is formed enables the formation of a protective film 3 that is uniform, and because forming the thin film 2 in advance prevents roughening of the surface of the support substrate 5, which may be caused when the protective film 3 is removed by dry etching. In this case, the thin film 2 is removed by wet etching.

To manufacture a backside-illuminated CMOS image sensor, a semiconductor substrate (i.e., semiconductor device) is formed by bonding the support substrate 5 and the device substrate 6, then, the device substrate 6 of this semiconductor substrate is thinned and subjected to processing such as bonding of a color filter to this device substrate 6, and the semiconductor substrate thus obtained is divided into individual pieces, thus forming a semiconductor device which is a backside-illuminated CMOS image sensor.

As described above, in the present embodiment, the thin film 2 is formed over the surface, back, and sides of the substrate 1, and then the protective film 3 is formed over the surface of the thin film 2. Next, the protective film 3 and thin film 2 formed over the surface of the substrate 1 are removed to expose the surface of the support substrate 5, and the joining layer 4 is formed over the surface of the exposed support substrate 5. Thereafter, the support substrate 5 and the target substrate are bonded together via the joining layer 4. As a result, metal contamination can be prevented during a wafer process performed after the target substrate and the support substrate 5 are bonded.

Second Embodiment

Figure 4A:
FIGS. 4A to 4C illustrate an example of a semiconductor device manufacturing method according to a second embodiment.
Figure 4B:
Figure 4C:

FIGS. 4A to 4C illustrate an example of a semiconductor device manufacturing method according to a second embodiment. The semiconductor device according to the second embodiment is used as, for example, a backside-illuminated CMOS image sensor. Compositional elements that have identical functions to those in the first embodiment are labeled with signs identical to those in the first embodiment, and the duplicate descriptions are omitted.

First, as illustrated in FIG. 4A, like the embodiment illustrated in FIG. 1, using a CVD or coating method, a thin film 2 is formed so as to cover all the faces (i.e., surface, back, and sides) of the substrate 1 formed from, for example, silicon. Then, a protective film 3 is formed so as to cover the entire thin film 2.

Next, as illustrated in FIG. 4B, using a CVD method, a spin coating method, or the like, a joining layer 7 is formed. The joining layer 7 may be formed from a material identical to that in the first embodiment. Where a spin coating method is used, the joining layer 7 may be formed from the same material as that in the first embodiment and may also be, for example, a SOG (Spin On Glass) film formed from silanol, MSQ (Methyl Silses Quioxane), which is an organic material, or a polyimide film. Alternatively, films of two or more materials may be bonded together to form the joining layer 7.

Thereafter, as illustrated in FIG. 4C, the surface of the joining layer 7 is smoothened by chemical and/or mechanical polishing, thereby completing a support substrate 8.

Figure 5:
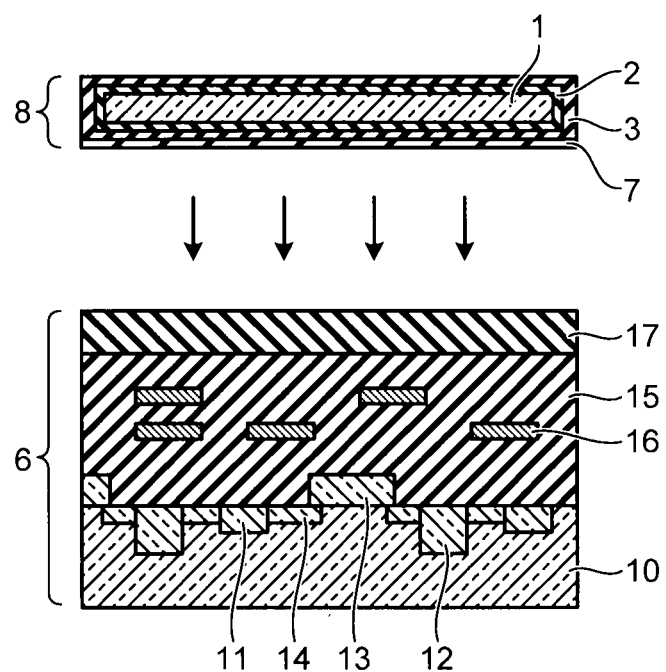
FIG. 5 illustrates the bonding of a support substrate and device substrate according to the second embodiment.

Subsequently, the support substrate 8 and a device substrate 6 or the like are bonded together. FIG. 5 illustrates the bonding of the support substrate 8 and the device substrate 6. The configuration of the device substrate 6 is identical to that in the first embodiment. A method for bonding the support substrate 8 and the device substrate 6 or the like is identical to that in the first embodiment.

Figure 6:
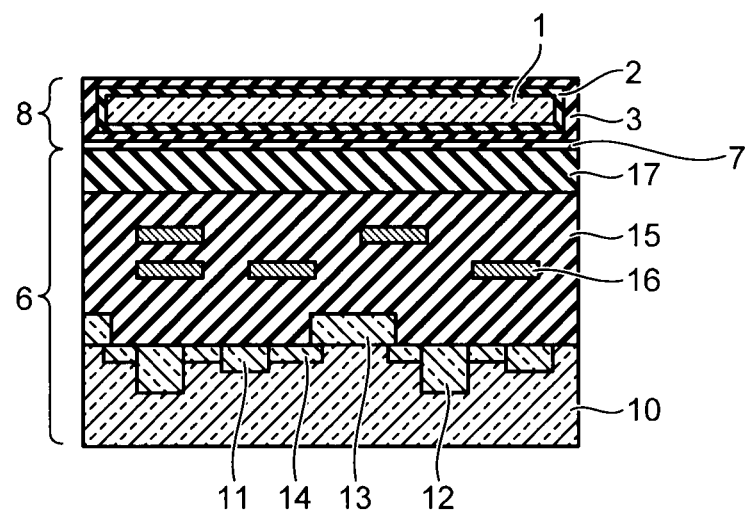
FIG. 6 illustrates an example of the configuration of a semiconductor substrate according to the second embodiment.

FIG. 6 illustrates an example of the configuration of the semiconductor substrate after the bonding process illustrated in FIG. 5 (i.e., the semiconductor substrate formed by bonding the device substrate 6 to the support substrate 8).

To manufacture a backside-illuminated CMOS image sensor, a semiconductor substrate (i.e., semiconductor device) is formed by bonding the support substrate 8 and the device substrate 6, then, the device substrate 6 of this semiconductor substrate is thinned and subjected to processing such as bonding of a color filter to this substrate 6, and the semiconductor substrate is divided into individual pieces, thus forming a semiconductor device, which is a backside-illuminated CMOS image sensor.

As described above, in the present embodiment, the thin film 2 is formed over the surface, back, and sides of the substrate 1, and then the protective film 3 is formed over the surface of the thin film 2. Subsequently, the joining layer 7 is formed over the protective film 3 formed over the surface of the substrate 1, and this joining layer 7 is made smooth, thereby forming a support substrate 8. Thereafter, the support substrate 8 and the target substrate are bonded together via the joining layer 7. As a result, metal contamination can be prevented during a wafer process performed after the target substrate and the support substrate 8 are bonded together.

Third Embodiment

Figure 7:
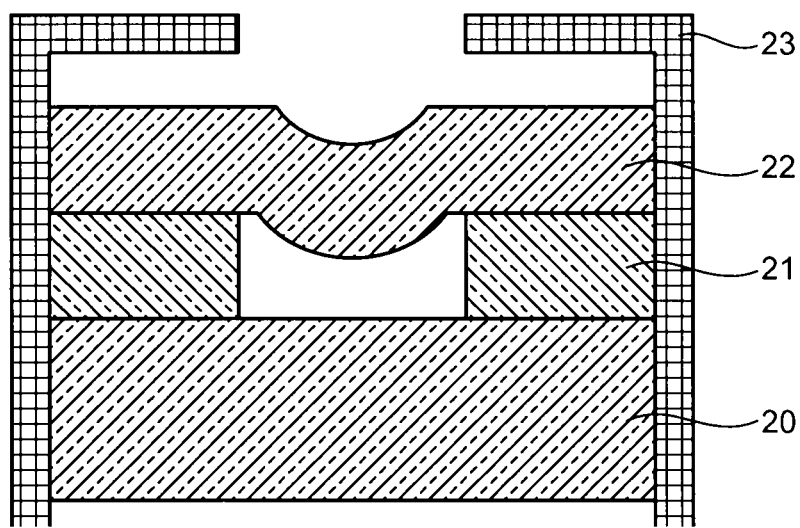
FIG. 7 is a schematic view illustrating an example of the configuration of a camera module according to a third embodiment.

FIG. 7 is a schematic view illustrating an example of the configuration of a camera module according to a third embodiment. The camera module according to the embodiment illustrates an example of the configuration of a camera module that uses a semiconductor device including the support substrate 5 according to the first embodiment or the support substrate 8 according to the second embodiment.

As illustrated in FIG. 7, the camera module according to the embodiment includes a semiconductor device 20, a spacer 21, a lens module 22, and a shield cap 23. The semiconductor device 20 is one obtained by the manufacturing method described in the first or second embodiment, such that after the support substrate 5 or 8 and the device substrate 6 are bonded together, the device substrate 6 is thinned and subjected to processing such as bonding of a color filter to the device substrate 6, and then the semiconductor device thus obtained is divided into individual pieces.

The configuration illustrated in FIG. 7 is an example, but, instead of this configuration, the camera module using the semiconductor element 20 may have any configuration.

Thus, in the embodiment, the camera module is formed using the semiconductor device including the support substrate 5 or 8. Accordingly, the camera module can be manufactured while metal contamination is prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing method comprising:
    forming an insulation film over a surface, backside, and sides of a first substrate;
    forming a joining layer over the surface of the first substrate; and
    bonding the first substrate to a second substrate via the joining layer;
    wherein after the insulation film is formed over the surface, backside, and sides of the first substrate, the insulation film is removed from the surface of the first substrate, and the joining layer is formed over the surface of the first substrate from which the insulation film has been removed.

2. The semiconductor manufacturing method according to claim 1, wherein the insulation film includes a thin film formed over the surface, backside, and sides of the first substrate, and a protective film formed over the thin film formed over the surface, backside, and sides of the first substrate.

3. The semiconductor manufacturing method according to claim 2, wherein the thin film is a silicon oxide film, and the protective film is a silicon nitride film or silicon carbide film.

4. The semiconductor manufacturing method according to claim 2, wherein removing the insulation film involves removing the protective film by dry processing and removing the thin film by wet processing.

5. The semiconductor manufacturing method according to claim 2, wherein the joining layer is formed by wet processing.

6. The semiconductor manufacturing method according to claim 1, further comprising:
    forming an insulation film over a surface, backside, and sides of a first substrate;
    forming a joining layer over the surface of the first substrate, and bonding the first substrate to a second substrate via the joining layer;
    wherein the joining layer is formed over the insulation film formed over the surface of the first substrate, and the insulation film includes a thin film formed over the surface, backside, and sides of the first substrate, and a protective film formed over the thin film formed over the surface, backside, and sides of the first substrate.

7. The semiconductor manufacturing method according to claim 6, wherein the thin film is a silicon oxide film, and the protective film is a silicon nitride film or silicon carbide film.

* * * * *